United States Patent [19]
Baker et al.

[11] Patent Number: 6,041,086
[45] Date of Patent: Mar. 21, 2000

[54] SIGNAL DECODING FOR EITHER MANHATTAN OR HAMMING METRIC BASED VITERBI DECODERS

[75] Inventors: Thomas W. Baker, North Whitehall Township, Pa.; Mohammed S. Mobin, Old Bridge, N.J.

[73] Assignee: Lucent Technologies Inc., Murray Hill, N.Y.

[21] Appl. No.: 08/628,073

[22] Filed: Apr. 4, 1996

[51] Int. Cl.[7] ................................................ H04L 27/06
[52] U.S. Cl. ...................... 375/341; 375/349; 714/795; 714/796
[58] Field of Search .................................... 375/262, 267, 375/340, 341, 347, 349; 714/794, 795, 796

[56] References Cited

U.S. PATENT DOCUMENTS

| | | | |
|---|---|---|---|
| 4,663,768 | 5/1987 | Ryu ...................................... | 375/267 X |
| 4,773,081 | 9/1988 | Morimoto ................................ | 375/267 |
| 5,408,502 | 4/1995 | How ........................................ | 375/340 |
| 5,444,721 | 8/1995 | Okanoue et al. ..................... | 375/341 X |
| 5,471,500 | 11/1995 | Blaker et al. ............................ | 375/340 |
| 5,619,539 | 4/1997 | Coker et al. ............................. | 375/341 |
| 5,638,408 | 6/1997 | Takaki ..................................... | 375/341 |

OTHER PUBLICATIONS

Giovanna D'Aria et al., Simulation and Performance of the Pan European Land Mobile Radio System, in IEEE Transactions on Vehicular Technology, vol. 41, No. 2 (May 1992), pp. 177–189.

Renato D'Avella et al., An Adaptive MLSE Receiver for TDMA Digital Mobile Radio, in IEEE Journal on Selected Areas in Communications, vol. 7, No. 1, (Jan. 1989), pp. 122–129.

G. David Forney, Jr., The Viterbi Algorithm, in Proceedings of the IEEE, vol. 61, No. 3 (Mar. 1973), pp. 268–278.

Joachim Hagenauer and Peter Hoeher, A Viterbi Algorithm with Soft–Decision Outputs and its Applications, in IEEE Global Telecommunications Conf. & Exhibition, vol. 3, pp. 1680–1686 (1989), pp. 1680–1686.

Wern–Ho Sheen and Gordon L. Stuber, MLSE Equilization and Decoding for Multipath–Fading Channels, in IEEE Transactions on Communications, vol. 39. No. 10 (Oct. 1991), pp. 1455–1464.

Kazuhiko Fukawa and Hiroshi Suzuki, Adaptive Equalization With RLS–MLSE For Frequency–Selective Fast Fading Mobile Radio Channels, in IEEE Global Telecommunications Conf., vol.1, (Dec. 1991), pp. 548–552.

Peyton Z. Peebles, Jr., *Digital Communication Systems*, pp. 87–97.

Vijay K. Bhargava et al., *Digital Communications By Satellite Modulation, Multiple Access and Coding*, pp. 98–102.

M. Morris Mano, *Computer Engineering Hardware Design*, pp. 11–17 (1988).

*Primary Examiner*—Young T. Tse

[57] ABSTRACT

A method and apparatus is presented for establishing an equivalence between the Hamming branch metric scheme and the Manhattan branch metric scheme. A signal format converter is presented to convert input signal in a first number system such as binary or two's complement, into a second number system. The signal format converter implemented at the input to a Viterbi decoder allows the use of a Viterbi decoder designed for a Manhattan metric sceme in an application where the signals are represented in two's complement. Similarly a Viterbi decoder designed for a Hamming metric scheme can be implemented in an application where the signals are represented in unsigned binary. The signal format converter can be used with both a hard decision Viterbi decoder and a soft decision Viterbi decoder. Where a soft decision Viterbi decoder is used the soft symbol of a Manhattan metric scheme based Viterbi decoder can be converted to an equivalent Hamming soft symbol by taking the two's complement of the absolute value of the accumulated cost difference. Where the Viterbi decoder is based on a Hamming metric scheme, an equivalent Manhattan soft symbol can be obtained by taking the absolute value of the soft symbol decoded output.

24 Claims, 2 Drawing Sheets

SIGNAL DECODING FOR EITHER MANHATTAN OR HAMMING METRIC BASED VITERBI DECODERS

FIELD OF THE INVENTION

The present invention is generally concerned with the compatibility of a Viterbi decoder designed to employ a particular metric calculation, with a signal, presented at its input, or required at its output, in a number system otherwise incompatible with that metric scheme. In particular, the present invention relates to a method for obtaining equivalent soft symbol decoded signals for Viterbi decoders employing either a Manhattan or Hamming metric scheme.

BACKGROUND OF THE INVENTION

Digital systems transmit quantized data. In a binary system, the quantized data is represented by either a zero or a one. During the transmission of digital signals, noise from a variety of sources corrupt the transmitted signal so that what is received is not necessarily the same signal that was transmitted. To compensate for noise and to enhance accurate detection, error-correction techniques are commonly employed.

One method for enhancing the accuracy in detecting a transmitted signal is to convolutionally encode the signal prior to transmission. Instead of transmitting the source signal, the encoded signal is transmitted. The convolutional encoder adds redundancy to the source signal by generating a predetermined number of bits according to a binary logic calculation for each source signal bit, or set of bits. The number of bits generated by the encoder is greater than the number of bits input to the encoder from the source signal. Consequently, information relating to the identity of each source signal bit is transmitted in more than one bit. Thus, the receiver has more opportunity to accurately detect the source signal bit than would be available if only the source signal bit was transmitted. The use of convolutional encoders is more fully described in Peyton Z. Peebles, Jr., *Digital Communication Systems*, pp.87–102 (Prentice Hall 1987) hereby incorporated by reference as if fully set forth herein.

Error correction techniques involve using the Viterbi algorithm in a receiver, as a Viterbi decoder. The premise of the Viterbi decoder is that for each signal received at a time instant, there exists a finite number of states to represent the source signal. As each signal is received, the Viterbi decoder traces a transition from each of a finite number of possible present states reflecting the signal received one time instant earlier, to each of a finite number of possible next states. Where the source signal was first convolutionally encoded prior to transmission, the Viterbi decoder uses the encoder scheme to generate a possible representation of the received signal, for each transition from present state to next state. Generally, a received signal is presented to the decoder as a symbol which comprises one or more bits. The size of the source signal corresponding to a received symbol set largely depends on the code rate. Thus for a rate one half encoder, where one source signal bit is transmitted as two bits, a symbol set comprises two bits and the corresponding source signal comprises one bit.

Thus, a set of transmitted digital signals are represented by one or more possible sequences of state transitions. Each transition is referred to as a branch, and a sequence of branches form a path. Since each branch indicates a possible representation of a transmitted digital signal, an error value equal to the difference between the Viterbi generated signal of a particular branch and the signal actually received at that corresponding time instant, can be computed and evaluated. This error is referred to as a branch metric. The branch metric can be used to determine whether a particular state at one time instant accurately represents a corresponding source signal. Since the accuracy of each state depends on the sequence of states at earlier time instants leading to that state, each state can be associated with an error, i.e., an accumulated cost value, which is equal to the sum of the sequence of branch metrics leading to that state. Likewise, after all the digital signals are received and the path is complete, an accumulated cost can be associated with each path. The path indicating the smallest error is selected to represent the sequence of source signal bits.

The Viterbi decoder is generally implemented in a receiver twice. A first Viterbi decoder is used to determine the transmitted bits from the received signal. This first Viterbi decoder is generally referred to as an equalizer. A second Viterbi decoder is used to determine the source signal from the transmitted bits based on the encoder scheme. The performance of the second Viterbi decoder is enhanced where the first Viterbi decoder is a soft decision decoder which provides a soft-symbol output. While a Viterbi decoder described above translates each received symbol set as a 0 or a 1 source bit, i.e. hard bits, a soft decision Viterbi decoder obtains an indication of the reliability of the hard bit, as well. For instance, a received signal having a value of 0.9 is likely to be quantized into a hard 1. Indeed, it is very likely that 0.9 was transmitted as a 1. Likewise, a value of 0.1 is likely to be quantized as a hard 0. Again, the probability is high that this quantization is correct. However, when the received signal is 0.5, the level of confidence that the signal was transmitted as a 0 or a 1 is very low.

One method for obtaining soft-symbol decision is described in U.S. Pat. No. 5,471,500 entitled "Soft-Symbol Decoding," which issued to Blaker on Nov. 28, 1995 and is commonly assigned with the present application, the disclosure of which is hereby incorporated by reference as if fully set forth herein. This method involves concatenating the decoded hard bit associated with a particular branch, with its branch metric. This combination is referred to as a soft symbol decoded signal. While the hard bit simply indicates the best choice from the available alternatives, the branch metric or the accumulated cost difference indicates the degree of error between the selected hard bit and the received digital signal. The soft symbol therefore provides a measure of the reliability of the selected hard bit.

Two common metric schemes for calculating branch metrics are "Manhattan" and "Hamming." In the Manhattan metric scheme, digital signals are usually represented in an unsigned binary number system. Thus, logical zero represented with eight digits in unsigned binary, is indicated by 0000 0000. Likewise, logical one is shown by 1111 1111. The branch metric of a given branch is calculated by taking the absolute value difference between each received digital signal and the corresponding digital signal computed internally by the Viterbi decoder and indicated by the branch. For the Manhattan branch metric scheme, the smallest error is indicated by an extremum branch metric, typically the smallest. Accordingly, a Viterbi decoder designed for a Manhattan branch metric will select as the most likely path, the path associated with the least cost relative to all possible paths.

In the Hamming branch metric scheme, digital signals are usually represented in a signed complement number system. In signed complement, the sign of the number is indicated by the most significant digit. Usually, a 0 indicates a positive value and a 1 indicates a negative value, although, the reverse is valid as well. The remaining digits, properly complemented, indicate the magnitude. The magnitude of a number with a leading 0 is the same as if the number was in unsigned binary form. For example, 0110 equals 6 in unsigned binary and +6 in a signed complement form where 0 indicates a positive value. A number having the same magnitude but the opposite sign of a second number, is represented by the complement of the second number. For example, −6 is represented by the complement of 0110, +6. One signed complement system is known as one's complement which involves changing all 0's to 1's and 1's to 0's. Thus −6 in one's complement form is shown as 1001. Another signed complement system is known as two's complement, which simply requires the addition of a 1 to the one's complement. Thus, −6 in two's complement form is shown as 1010. Hamming metrics often involve two's complement. A description of complements and mathematical operations with numbers in a complement number system can be found in M. Morris Mano, *Computer Engineering: Hardware Design*, pp. 11–17 (Prentice Hall 1988), hereby incorporated by reference as if fully set forth herein.

One implementation of the Hamming metric scheme referred to as Hamming 1, maps logical one to a positive one and logical zero to a negative one, so that logical one represented with eight digits in two's complement will be shown by 0111 1111 and logical zero will be shown by a 1000 0000. Alternatively, the Hamming 2 branch metric scheme maps logical one to a negative one and logical zero to a positive one, such that logical one will be shown by 1000 0000 and logical zero will be shown by 0111 1111. As described, the two Hamming metric schemes are the one's complement of each other.

In contrast to a Manhattan metric scheme based decoder, a Viterbi decoder designed for a Hamming metric scheme will select the path associated with the highest positive or negative cost relative to all possible paths. The reason for this stems from the calculation of the Hamming branch metric. Instead of calculating the absolute value difference between each received digital signal and the corresponding digital signal computed internally by the Viterbi decoder, as is done for Manhattan metrics, Hamming takes into consideration the sign of the magnitude of the signal. One familiar with mathematical operations of numbers in a signed complement system, will readily recognize that the smallest error in Hamming, is indicated by the largest branch metric.

As stated above, a Viterbi decoder designed for a Manhattan metric scheme will typically select the path associated with the least cost. However, the path associated with the least cost, represents the best path only when the signal to be decoded is in unsigned binary. In this system, the closer in value the received signal is to 0, the more likely the signal was transmitted as a 0. Similarly, the closer in value the received signal is to 1 the more likely the signal was transmitted as a 1. In either case, the difference in value between the received signal and the most likely transmitted signal bit is less than the difference in value between the received signal and any other possible representation of the transmitted signal. Thus, a Manhattan metric scheme based Viterbi decoder is only compatible with an input signal in unsigned binary. Likewise a soft decision Viterbi decoder results in a soft symbol decoded output in unsigned binary.

In contrast, a Viterbi decoder designed for a Hamming metric scheme typically selects the path associated with the greatest positive or negative cost. To properly select the most likely path, the signal received by the Viterbi decoder must be in a signed complement system, preferably two's complement.

When a digital signal is represented in two's complement and confined to a certain number of digits, for example eight, logical 1 will be represented by a range of discrete values, each value indicative of a different degree of confidence. Logical 0 is also represented by a range of discrete values indicative of different degrees of confidence. A particular degree of confidence for logical 1 is indicated by the two's complement of the value indicating the same degree of confidence for logical 0.

For example, an eight-digit number in Hamming 2, where logical 1 is mapped to positive values, i.e., leading 0's and logical 0 mapped to negative values, i.e., leading 1's, the lowest confidence 1 and 0 are indicated by 0000 0000 and 1111 1111, respectively. The highest confidence 1 and 0 are indicated by 0111 1111 and 1000 0000, respectively. For Hamming 1 where logical 1 is mapped to negative values and logical 0 is mapped to positive values, the lowest confidence 1 and 0 are indicated by 1111 1111 and 0000 0000, respectively.

Although an astute reader will recognize that the numbers representing the extreme confidence levels of logical 1 and 0 are actually one's complement of each other, intermediate levels of confidence for logical 1 and 0 are indicated by two's complement.

The problem arises in signal processing applications where some aspects of an application, such as an Equalizer in a decoder, employ either a Manhattan or Hamming branch metric scheme, while other aspects of the same application, such as the second stage Viterbi decoder, are configured for the other branch metric scheme.

More specifically, some applications are designed to represent signals in two's complement. Consequently, any component, such as a Viterbi decoder, that must calculate or recognize a metric, must do so in Hamming. The same is true for an application designed to represent signals in an unsigned binary system. Traditionally, these two systems require components specifically designed for their number system. In other words, Hamming for the first system and Manhattan for the second. This is inefficient where both components are required for the same task. Moreover, it may be the case that the component designed for Manhattan performs better than the same component designed for Hamming or vice versa. It would then be advantageous to be able to use the Manhattan component even with an application that traditionally requires a Hamming component.

SUMMARY OF THE INVENTION

Accordingly, the present invention provides a method and apparatus to convert a digital signal represented by a first number system which is incompatible with the design of a component to receive the signal, to a second number system which is compatible with the component. The invention is particularly useful where the component is a Viterbi decoder. Where a Viterbi decoder designed for a Manhattan metric scheme receives a digital signal in signed complement, the number system format of the signal is first converted to unsigned binary and then input to the decoder. Similarly, a signal in an unsigned binary format presented to a Viterbi decoder designed for a Hamming metric scheme, is first converted to a signed complement format before it is input to the decoder.

The present invention also allows converting the first number system of a soft symbol output of a first Viterbi decoder to a second number system before presenting the soft symbol output to a second Viterbi decoder whose metric scheme is compatible with the second number system but not the first number system. Proper number system representation of an input signal and proper conversion of the output signal, provides equivalent soft symbol decoded output for both Manhattan and Hamming metric scheme based decoders. Where the decoder employs a Manhattan metric scheme, a soft symbol in unsigned binary is obtained by taking the absolute value of the soft symbol decoded output, while an equivalent soft symbol in signed complement is obtained by converting the absolute value of the soft symbol decoded output to a signed complement number system. Where the decoder employs a Hamming metric scheme, the soft symbol decoded output is in signed complement while a soft symbol output in an unsigned binary number system is obtained by taking the absolute value of the soft symbol decoded output.

The present invention also provides a system to convert digital signals from one number system to another. For a Viterbi decoder where the number system must be compatible with its metric scheme, the system comprises the combination of a Viterbi decoder and a signal converter at its input. Where the number system output of the decoder, especially for soft symol output is different from that required for further processing, the signal converter can be combined at the output of the decoder, as well.

DETAILED DESCRIPTION OF THE INVENTION

Figure 1:
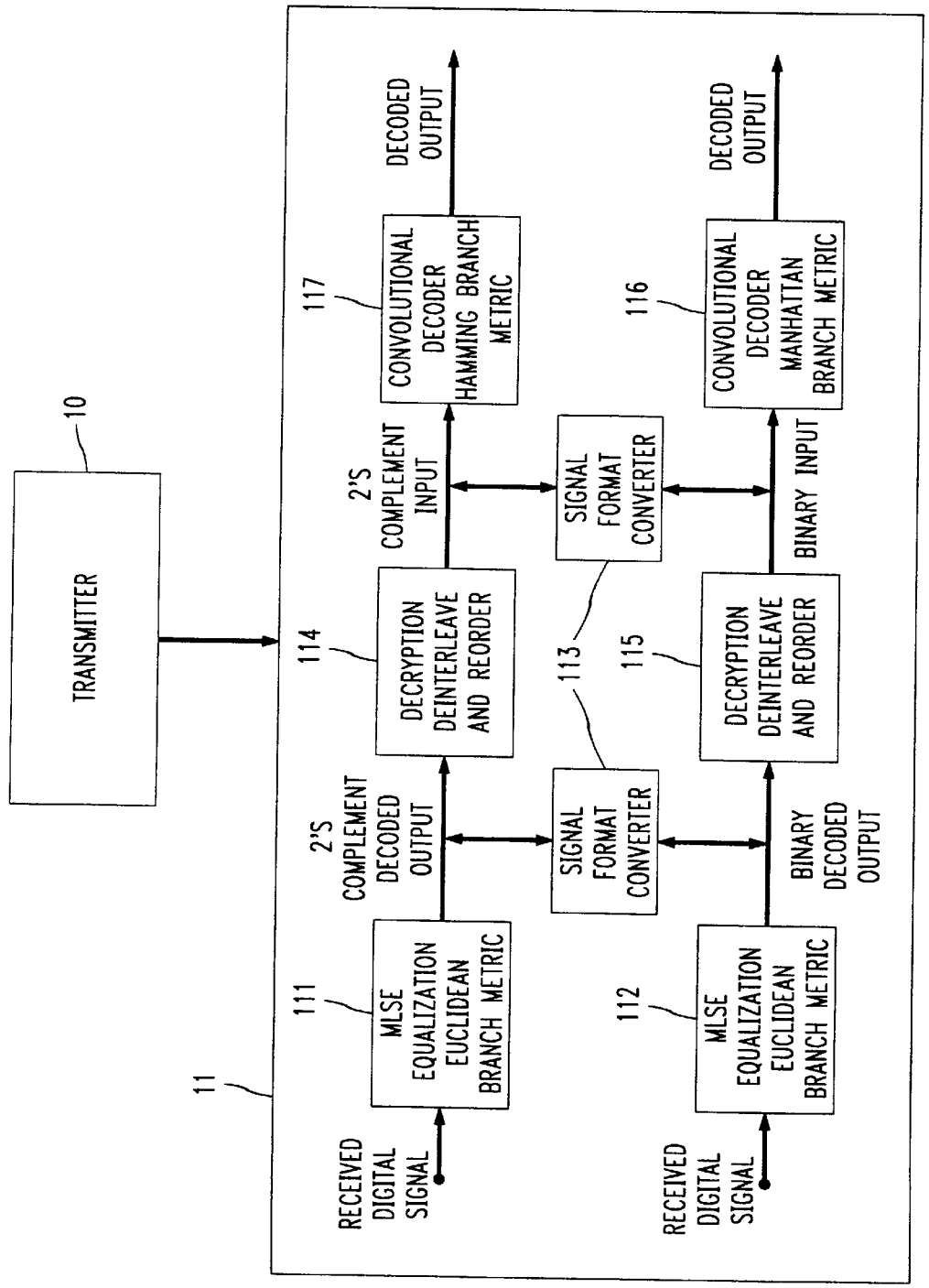
FIG. 1 is a block diagram of a portion of a transceiver depicting one implementation of the present invention.

The present invention as described below, has useful application in communication systems, such as earth to satellite communications and digital cellular telephony between a cellular telephone and a base station. Referring to FIG. 1, a transceiver is shown comprising a transmitter (10) and a receiver (11). Receiver (11) is shown with some of the components commonly found in a receiver. A maximum likelihood sequence estimate equalizer ("MLSE") (112), decryption deinterleave and reorder (115) and Viterbi decoder (116) are all designed to receive an input and provide an output in unsigned binary form. MLSE (111), decryption, deinterleave and reorder (114) and Viterbi decoder (117), are all designed to receive an input and provide an output in two's complement form. Viterbi decoder (116) is also designed for a Manhattan metric scheme, while Viterbi decoder (117) is designed for a Hamming metric sheme. As shown in FIG. 1, Signal Format Converter (113) is capable of receiving a digital signal in either unsigned binary or in a signed complement system, and converting the number system of the digital signal from one to the other. The relationship between these two systems, for Manhattan and Hamming, is shown in Table 1, in which numbers are represented in hexadecimal notation.

TABLE 1

| Most reliable 0 | Worst 0 | Worst 1 | Most reliable 1 | |
|---|---|---|---|---|
| 0x00 | 0x7F | 0x80 | 0xFF | Manhattan |
| ├─── | ───────────┼─── | ────────┼─── | | |
| 0x7F | 0x00 | 0xFF | 0x80 | Hamming 1 |
| 0x80 | 0xFF | 0x00 | 0x7F | Hamming 2 |

Signal Format Converter (113) can be implemented at the input, as well as at the output of a Viterbi Decoder. For example, if it was desired to input a digital signal represented in two's complement to Viterbi Decoder (116) which is designed for a Manhattan metric scheme, Signal Format Converter (113) can be placed at the input to Viterbi decoder (116) to convert the signal to two's complement. Likewise, Signal Format Converter (113) placed at the input to Viterbi decoder (117) which is designed for a Hamming metric scheme, makes Viterbi decoder (117) compatible with an input digital signal in unsigned binary.

Given a Viterbi decoder, its output will be in a number system compatible with the decoder's metric scheme. Where that output is to be presented to another component that requires an input in a different number scheme, such as the output of Equalizer (111) to be presented to Viterbi decoder (116), Signal Format Converter (113) can be implemented to convert the signal at the output of Equalizer (111).

In general, Signal Format Converter (113) is designed to convert an incoming digital signal in one number system to a second number system. The converted digital signal can be passed along to any device or software operation that is incompatible with a first number system, yet compatible with the second number system.

One skilled in the art will readily recognize that the Signal Format Converter of the present invention can be implemented in software, or hardware. The Signal Format Converter and the decoder of the present invention are suitable for fabrication on an integrated circuit using Very Large Scale Integrated Circuit ("VLSI") technology.

As described above, Signal Format Converter (113) can be used with a hard decision Viterbi decoder and with a soft decision Viterbi decoder. This implementation is based on the premise that the Hamming and Manhattan metrics are related and this relationship can be exploited to establish an equivalence so as to allow the use of a Manhattan metric scheme based decoder in a receiver employing two's complement and vice versa.

Referring to Table 2, an illustration of the relationship between Manhattan and two Hamming metric schemes, Hamming 1 and Hamming 2, is shown for the particular case of a convolutional encoder rate of one half, where each bit is transmitted as two bits. Thus, four states define the state space of the Viterbi algorithm: 0,0; 0,1; 1,0; and 1,1. In other words, the received pair, r0 and r1, was transmitted as one of these four pairs. It will be readily understood by one skilled in the art that the present invention is not limited to a particular code rate and that the exemplary code rate one half is merely used for the purpose of illustration.

For each received signal the Viterbi decoder generates two bits ("di bit") for each possible transition from each of the present states to a next state. The equations corresponding to each of the metric schemes for each generated di bit represent the branch metric calculation.

TABLE 2

| State generating di-bits | | Hamming 1 branch metric calculation | Hamming 2 branch metric calculation | Manhattan branch metric calculation |
|---|---|---|---|---|
| c1 | 0,0 | r0 + r1 | −r0 − r1 | r0 + r1 |
| c2 | 0,1 | r0 − r1 | −r0 + r1 | r0 + ~~r1~~ |
| c3 | 1,0 | −r0 + r1 | r0 − r1 | ~~r0~~ + r1 |
| c4 | 1,1 | −r0 − r1 | r0 + r1 | ~~r0~~ + ~~r1~~ |

To illustrate the calculations of the branch metrics shown in Table 2 consider r0=0110, and r1=1010. In unsigned binary, the value of r0 is 6 in base ten, and r1 is 10 in base ten. To calculate the Manhattan metric for the di-bit 0,0 each of the bits must first be converted into a four digit binary number, namely 0000 and 0000. Each generated bit is then subtracted from the corresponding received symbol. Thus r0 minus 0, equals 0. Similarly, r1 minus 0, equals r1. Therefore, as reflected in Table 2, the Manhattan branch metric corresponding to di-bit 0,0 is r0+r1.

Referring to row c2, where the second generated bit is a 1, represented as 1111, the Manhattan metric, r1−1, is computed as follows. The subtraction $$\begin{array}{r}1010\\-1111\end{array},$$

can be converted to an addition operation by replacing 1 with its two's complement, $$\begin{array}{r}1010\\+0001\\\hline 1011\end{array}.$$

The metric equals the two's complement of the sum 1011, which is 0101. 0101 is also the one's complement of r1. The one's complement is obtained by simply converting every 0 to a 1, and every 1 to a 0. The one's complement of r1 is shown by a line passing through r1 (i.e., ~~r1~~).

As demonstrated, the Manhattan metric involves the difference between the received symbol set and generated bits. In contrast, the Hamming metric involves a probability which is arrived at by multiplying the received symbol set by its corresponding generated bit. Recall that in the Hamming metric scheme, 0 and 1 are mapped to positive and negative values. Therefore, as shown in Table 2 for Hamming 1, where 0 is mapped to positive values, r0 and r1 multiplied by 0, equals r0 and r1, respectively. r0 and r1 multiplied by 1, equals −r0 and −r1, respectively.

Similarly for Hamming 2, the generated bits are multiplied by their corresponding received symbols. Since 0 is mapped to negative values, r0 and r1 multiplied by 0, equals −r0 and −r1, respectively. r0 and r1 multiplied by 1, equals r0 and r1, respectively.

Having gone through the branch metric calculations for the different metric schemes, one can further correlate the metrics for these three schemes by taking the metric difference between any two states. Referring to Table 3, one can see that the absolute value of the metric difference between two states is the same for each of the three metrics. It should be noted that a subtraction operation between a first and second number can be changed to an addition operation by replacing the second number with its complement. Thus r1− ~~r1~~ equals r1+r1, which equals 2r1.

TABLE 3

| Metric difference between two states | Hamming branch metric calculation (mapping one) | Hamming branch metric calculation (mapping two) | Manhattan branch metric difference |
|---|---|---|---|
| c1 − c2 | 2r1 | −2r1 | r1 − ~~r1~~ |
| c1 − c3 | 2r0 | −2r0 | r0 + ~~r0~~ |
| c1 − c4 | 2r0 + 2r1 | −2r0 − 2r1 | (r0 − ~~r0~~) + (r1 − ~~r1~~) |
| c2 − c3 | 2r0 − 2r1 | −2r0 + 2r1 | (r0 − ~~r0~~) − (r1 − ~~r1~~) |
| c2 − c4 | 2r0 | −2r0 | r0 − ~~r0~~ |
| c3 − c4 | 2r1 | −2r1 | r1 − ~~r1~~ |

A soft decision Viterbi decoder uses an accumulated cost difference for its soft symbol output, in other words the difference between two paths. Thus, by using the proper number system at the Viterbi decoder input and talking the absolute value of the decoder output, one can use the present invention to obtain a valid soft symbol decoded output, regardless of the metric scheme of the decoder and the initial number system of the received signal. Where the decoder is designed to employ Manhattan metrics, the Viterbi decoder output will be in unsigned binary. If Hamming metric is required for future processing, the absolute value of the soft symbol decoded output can simply be converted to two's complement form, or any signed complement with the signal format converter of the present invention.

Similarly, where the soft symbol decoded output of the Viterbi decoder is designed for Hamming, the output, regardless of the number system of the received symbol, will be in a signed complement system. If an unsigned number system is necessary for future processing, the signal format converter of the present invention can simply convert the soft symbol into an unsigned number system. In either case, the soft symbol accurately reflects the reliability of the decoded signal.

Figure 2:
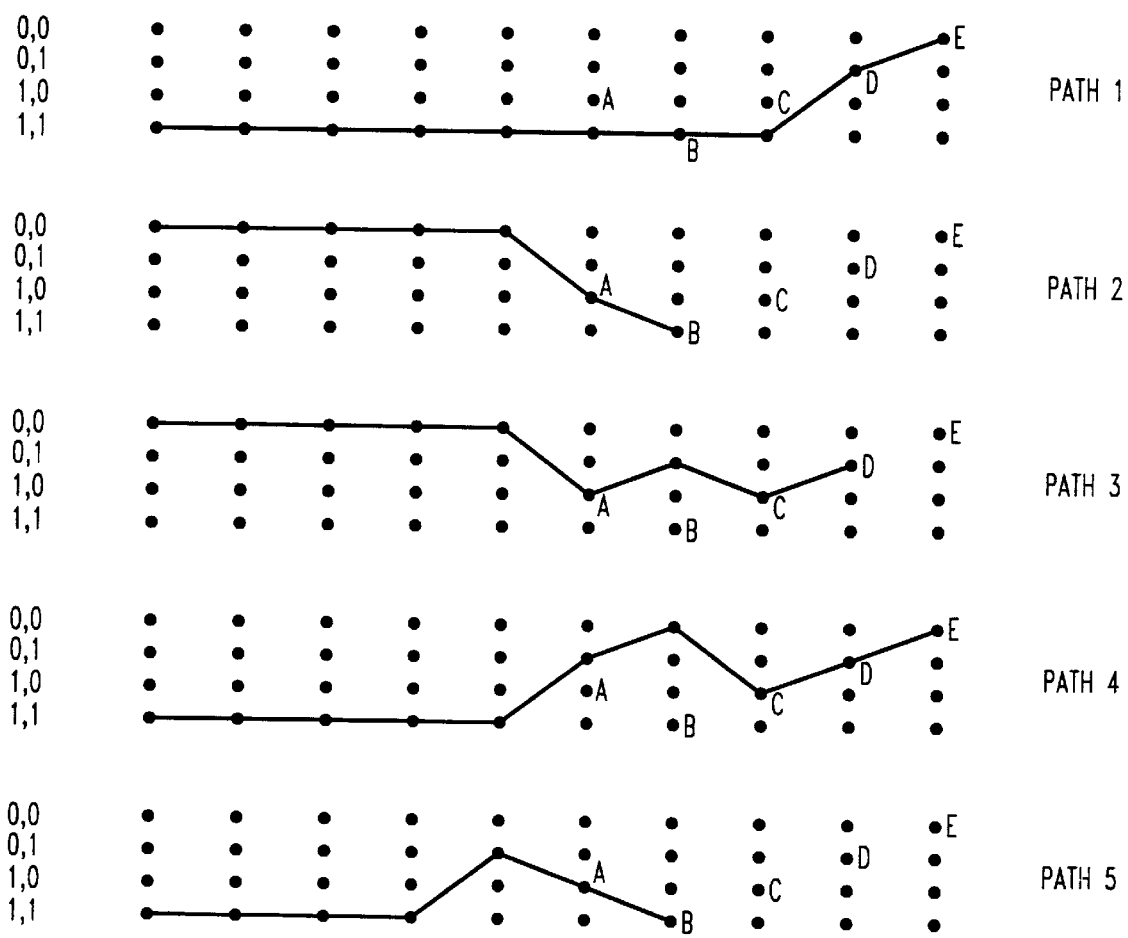
FIG. 2 illustrate five arbitrary trellis paths of a Viterbi decoder.

Referring to FIG. 2 for purposes of illustration, five different trellis paths are shown, representing the state transitions of a Viterbi decoder which internally generates di-bits according to the formula of Table 4.

TABLE 4

| Transitions | di bit |
|---|---|
| 0,0 → 0,0 | 0,0 |
| 0,0 → 1,0 | 1,1 |
| 0,1 → 0,0 | 0,1 |
| 0,1 → 1,0 | 1,0 |
| 1,0 → 0,1 | 1,1 |
| 1,0 → 1,1 | 0,0 |
| 1,1 → 0,1 | 1,0 |
| 1,1 → 1,1 | 0,1 |

The relationships between transitions and di-bits are based on the convolutional encoder scheme. In this example, the generating polynomials for the two bits transmitted for each single source bit are $g(0)=1+D^1$ and $g(1)=1+D^1+D^2$.

TABLE 5

| | Time instants | | | | | | | | |
|---|---|---|---|---|---|---|---|---|---|
| receiving for Manhattan | 0X00, 0XFF | 0X00, 0XFF | 0X00, 0XFF | 0X00, 0XFF | 0X00, 0XFF | 0X00, 0XFF | 0X40, 0XFF | 0XFF, 0X40 | 0X00, 0X7F |
| receiving for Hamming 1 | 0X7F, 0X80 | 0X7F, 0X80 | 0X7F, 0X80 | 0X7F, 0X80 | 0X7F, 0X80 | 0X7F, 0X80 | 0X3F, 0X80 | 0X80, 0X3F | 0X7F, 0X80 |
| receiving for Hamming 2 | 0X80, 0X7F | 0X80, 0X7F | 0X80, 0X7F | 0X80, 0X7F | 0X80, 0X7F | 0X80, 0X7F | 0XC0, 0X7F | 0X7F, 0XC0 | 0X80, 0X7F |

For this example, the received signals had the values shown in Table 5. Note that the values are written in hexadecimal notation to avoid strings of eight digits. The branch metric for each transition and the accumulated cost at each state, for each path, is shown in Tables 6, 7, and 8 for Manhattan, Hamming 1 and Hamming 2, respectively.

TABLE 6

| | Manhattan | | | | | | | | |
|---|---|---|---|---|---|---|---|---|---|
| path 1 | 0 | 0 | 0 | 0 | 0 | 0 | 64 | 64 | 0 |
| accum 1 | 0 | 0 | 0 | 0 | 0 | 0 | 64 | 128 | 128 |
| path 2 | 255 | 255 | 255 | 255 | 255 | 255 | X | X | X |
| accum 2 | 255 | 510 | 765 | 1020 | 1275 | 1530 | | | |
| path 3 | 255 | 255 | 255 | 255 | 255 | 255 | 446 | 191 | X |
| accum 3 | 255 | Sl0 | 765 | 1020 | 1275 | 1530 | 1976 | 2167 | |
| path 4 | 0 | 0 | 0 | 0 | 510 | 0 | 191 | 191 | 0 |
| accum 4 | 0 | 0 | 0 | 0 | 510 | 510 | 701 | 892 | 892 |
| path 5 | 0 | 0 | 0 | 510 | 510 | 255 | X | X | X |
| accum 5 | 0 | 0 | 0 | 510 | 1020 | 1275 | | | |

TABLE 7

| | Hamming 1 | | | | | | | | |
|---|---|---|---|---|---|---|---|---|---|
| path 1 | 255 | 255 | 255 | 255 | 255 | 255 | 191 | 191 | 255 |
| accum 1 | 255 | 510 | 765 | 1020 | 1275 | 1530 | 1721 | 1912 | 2167 |
| path 2 | -1 | -1 | -1 | -1 | 1 | -1 | X | X | X |
| accum 2 | -1 | -2 | -3 | 4 | -3 | 4 | | | |
| path 3 | -1 | -1 | -1 | -1 | 1 | 1 | -191 | 65 | X |
| accum 3 | -1 | -2 | -3 | -4 | -3 | -2 | -193 | -128 | |
| path 4 | 255 | 255 | 255 | 255 | -255 | 255 | 65 | 65 | 255 |
| accum 4 | 255 | 510 | 765 | 1020 | 765 | 1020 | 1065 | 1085 | 1405 |
| path 5 | 255 | 255 | 255 | -255 | -255 | -1 | X | X | X |
| accum 5 | 255 | 510 | 765 | 510 | 255 | 254 | | | |

TABLE 8

| | Hamming 2 | | | | | | | | |
|---|---|---|---|---|---|---|---|---|---|
| path 1 | 255 | 255 | 255 | 255 | 255 | 255 | 191 | 191 | 255 |
| accum 1 | 255 | 510 | 765 | 1020 | 1275 | 1530 | 1721 | 1912 | 2167 |
| path 2 | 1 | 1 | 1 | 1 | -1 | 1 | X | X | X |
| accum 2 | 1 | 2 | 3 | 4 | 3 | 4 | | | |
| path 3 | 1 | 1 | 1 | 1 | -1 | -1 | -191 | 63 | X |
| accum 3 | 1 | 2 | 3 | 4 | 3 | 2 | -189 | -126 | |
| path 4 | 255 | 255 | 255 | 255 | -255 | 255 | 63 | 63 | 255 |
| accum 4 | 255 | 510 | 765 | 1020 | 765 | 1020 | 1083 | 1146 | 1401 |
| path 5 | 255 | 255 | 255 | -255 | -255 | 1 | X | X | X |
| accum 5 | 255 | Sl0 | 765 | 510 | 255 | 256 | | | |

Referring now to Table 9, it is readily apparent that the absolute value of the cost difference between any two paths is effectively the same regardless of the metric scheme and corresponding number system used. For example, the accumulated cost difference between paths 2 and 4 is 765 −768 and −762 for Manhattan, Hamming 1 and Hamming 2 metric schemes, respectively. A closer equivalence can be realized by taking the one's complement of the subtrahend, rather than the two's complement during the subtraction in calculating the Hamming branch metric. Thus the soft symbol, which is based on the absolute value of the accumulated cost difference, is unaffected by the metric scheme design of the Viterbi decoder.

TABLE 9

| Node | Accumulated Cost Difference | Manhattan | Hamming 1 | Hamming 2 |
|---|---|---|---|---|
| Node A | diff 2, 4 | 765 | −768 | −762 |
| Node B | diff 1, 2 | −1530 | 1534 | 1526 |
| | diff 1, 5 | −1275 | 1276 | 1274 |
| | diff 2, 5 | 255 | −258 | −252 |
| Node C | diff 3, 4 | 1275 | −1278 | −1272 |
| Node D | diff 1, 3 | −2039 | 2040 | 2038 |
| | diff 1, 4 | −764 | 762 | 766 |

The foregoing merely illustrates the principles of the present invention. Those skilled int he art will be able to devise various modifications, which although not explicitly described or shown herein, embody the principles of the invention and are thus within its spirit and scope.

What is claimed is:

1. A method for decoding a received digital signal carrying predetermined information, which may be represented in any one of two or more different number systems, with a decoder which decodes said received digital signal based on a metric scheme which requires said digital signal to be represented in a particular number system, comprising the steps of:
   receiving said digital signal,
   converting the received digital signal to the particular number system required by said decoder, and
   decoding the predetermined information represented by said converted number system in a single pass through said decoder to provide the decoded predetermined information.

2. A method according to claim 1 wherein said predetermined information carried by said received digital signal is represented in a signed binary system, said particular number system is an unsigned binary system and said metric scheme is a Manhattan metric scheme.

3. A method according to claim 2, wherein said decoder is a Viterbi decoder.

4. A method according to claim 3 wherein said Viterbi decoder is a soft decision Viterbi decoder whose output is a soft symbol decoded output.

5. A method according to claim 4 wherein said soft decision Viterbi decoder provides at its output, a soft symbol equal to an accumulated cost difference, and wherein said decoding step includes obtaining said accumulated cost difference.

6. A method according to claim 5, wherein said decoding step includes computing a signed complement of said accumulated cost difference.

7. A method according to claim 5, wherein said decoded step includes obtaining an absolute value of said accumulated cost difference and converting said absolute value accumulated cost difference to the unsigned binary number system.

8. A method according to claim 2, wherein said signed binary system is a signed complement system.

9. A method according to claim 8, wherein said signed complement system is two's complement.

10. A method according to claim 8, wherein said signed complement system is one's complement.

11. A method according to claim 1 wherein said predetermined information carried by said received digital signal is represented in an unsigned binary system, said particular number system is a signed binary system and said metric scheme is a Hamming metric scheme.

12. A method according to claim 11, wherein said decoder is a Viterbi decoder.

13. A method according to claim 12 wherein said Viterbi decoder is a soft decision Viterbi decoder whose output is a soft symbol decoded output.

14. A method according to claim 11, wherein said signed binary system is a signed complement system.

15. A method according to claim 14, wherein said signed complement system is two's complement.

16. A method according to claim 14, wherein said signed complement system is one's complement.

17. Apparatus for decoding a received digital signal carrying predetermined information which may be represented in any one of two or more different number systems, with a decoder which decodes said received digital signal based on a metric scheme which requires said digital signal to be represented in a particular number system, comprising means for receiving said digital signal;

means for converting the digital signal to the particular number system required by said decoder; and means for decoding the predetermined information represented by said converted number system in a single pass through said decoder to provide the decoded predetermined information.

18. Apparatus for decoding a digital signal carrying predetermined information represented in one of several different number systems with a decoder that decodes said digital signal based on a metric scheme requiring said digital signal to be represented in a first number system, comprising:

a receiver for receiving said digital signal;

a signal format converter for converting said digital signal to said first number system; and a decoder for decoding the predetermined information represented by said digital signal that has been converted into said first number system in a single pass through said decoder to provide the decoded predetermined information.

19. An apparatus according to claim 18, wherein said signal format converter and said decoder are fabricated as an integrated circuit.

20. An apparatus according to claim 18, wherein said decoder is a Viterbi decoder.

21. An apparatus according to claim 18, wherein said decoder is a soft decision Viterbi decoder whose output is a soft symbol decoded output.

22. An apparatus according to claim 21, wherein said soft decision Viterbi decoder provides at its output a soft symbol equal to an accumulated cost difference and wherein said decoder includes means for obtaining the absolute value of said accumulated cost difference.

23. An apparatus according to claim 22, wherein said decoded output is desired to be represented in an unsigned binary number system, and said Viterbi decoder is designed to compute a Manhattan branch metric, wherein said decoder includes means for converting said absolute value of said accumulated cost difference into the unsigned binary number system.

24. An apparatus according to claim 21, wherein said decoded output is desired to be represented in a signed complement system, and said Viterbi decoder is designed to compute a Hamming branch metric, wherein said decoder further includes means for computing a signed complement of an absolute value of an accumulated cost difference.

* * * * *